United States Patent
Liu et al.

(10) Patent No.: US 12,310,133 B2
(45) Date of Patent: May 20, 2025

(54) CMOS IMAGE SENSOR WITH MULTIPLE SENSITIVITIES FOR HIGH DYNAMIC RANGE IMAGING AND LED FLICKER MITIGATION

(71) Applicant: OMNIVISION TECHNOLOGIES, INC., Santa Clara, CA (US)

(72) Inventors: Chengming Liu, Fremont, CA (US); Zhiqiang Lin, Fremont, CA (US); Duli Mao, Sunnyvale, CA (US); Lingtao Jiang, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 554 days.

(21) Appl. No.: 17/244,776

(22) Filed: Apr. 29, 2021

(65) Prior Publication Data
US 2022/0352224 A1    Nov. 3, 2022

(51) Int. Cl.
H01L 27/146 (2006.01)
H10F 39/00 (2025.01)
H10F 39/18 (2025.01)
G02B 5/20 (2006.01)

(52) U.S. Cl.
CPC ....... *H10F 39/8053* (2025.01); *H10F 39/182* (2025.01); *H10F 39/8063* (2025.01); *G02B 5/205* (2013.01)

(58) Field of Classification Search
None
See application file for complete search history.

(56) References Cited

U.S. PATENT DOCUMENTS

| | | | |
|---|---|---|---|
| 9,666,631 B2* | 5/2017 | Lyu | H10F 39/806 |
| 10,437,120 B1 | 10/2019 | Jutamulia et al. | |
| 11,764,241 B2* | 9/2023 | Do | H04N 25/59 |
| | | | 348/294 |
| 2014/0307133 A1* | 10/2014 | Kawai | H04N 13/218 |
| | | | 348/273 |
| 2014/0313350 A1* | 10/2014 | Keelan | H10F 39/8053 |
| | | | 348/188 |
| 2018/0027196 A1* | 1/2018 | Yang | H10F 39/803 |
| | | | 348/273 |
| 2020/0286944 A1* | 9/2020 | Boettiger | H10F 39/805 |

* cited by examiner

*Primary Examiner* — Ali Naraghi
(74) *Attorney, Agent, or Firm* — Christensen O'Connor Johnson Kindness PLLC

(57) ABSTRACT

CMOS image sensor with multiple sensitivities for high dynamic range imaging and LED flicker mitigation. In one embodiment, an image sensor includes a plurality of pixels arranged in rows and columns of a pixel array that is disposed in a semiconductor substrate. Each pixel includes a plurality of cells. A plurality of color filters is disposed over corresponding plurality of cells. The plurality of color filters corresponding to the plurality of cells of an individual pixel have more than one filtering strength for each color of the plurality of color filters.

9 Claims, 17 Drawing Sheets

CMOS IMAGE SENSOR WITH MULTIPLE SENSITIVITIES FOR HIGH DYNAMIC RANGE IMAGING AND LED FLICKER MITIGATION

BACKGROUND INFORMATION

Field of the Disclosure

This disclosure relates generally to the design of image sensors, and in particular, relates to image sensors that are suitable for high dynamic range imaging.

Background

Image sensors have become ubiquitous. They are widely used in digital still cameras, cellular phones, security cameras, as well as medical, automotive, and other applications. The technology for manufacturing image sensors continues to advance at a great pace. For example, the demands for higher image sensor resolution and lower power consumption motivate further miniaturization and integration of image sensors into digital devices.

In some applications, a dynamic range of a nature scene may be larger than the dynamic range of image sensors. Capturing such images having high dynamic ranges (HDRs) typically includes capturing a group of images using different exposure times, followed by combining acquired images into a composite image that is characterized by high dynamic range. However, since the individual images are captured at slightly different times, any change in the scene may cause motion artifacts. Furthermore, when images include light emitting diodes (LEDs), LED flicker may occur, especially so for the LEDs that are controlled by pulse width modulation (PWM), because camera exposure may miss the LED pulse. Flickering issues may become even more relevant for the HDR capture, since the bright part of image is usually captured using shorter exposure time of the image sensor, therefore making it more likely that the image sensor misses the active part of the PWM. For car viewing systems, LED flicker may cause dangerous situations as drivers may interpret flickering LEDs to represent emergency lights. Furthermore, an automated driver assistance system (ADAS) may fail to detect road signs and traffic signals due to LED flickering.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
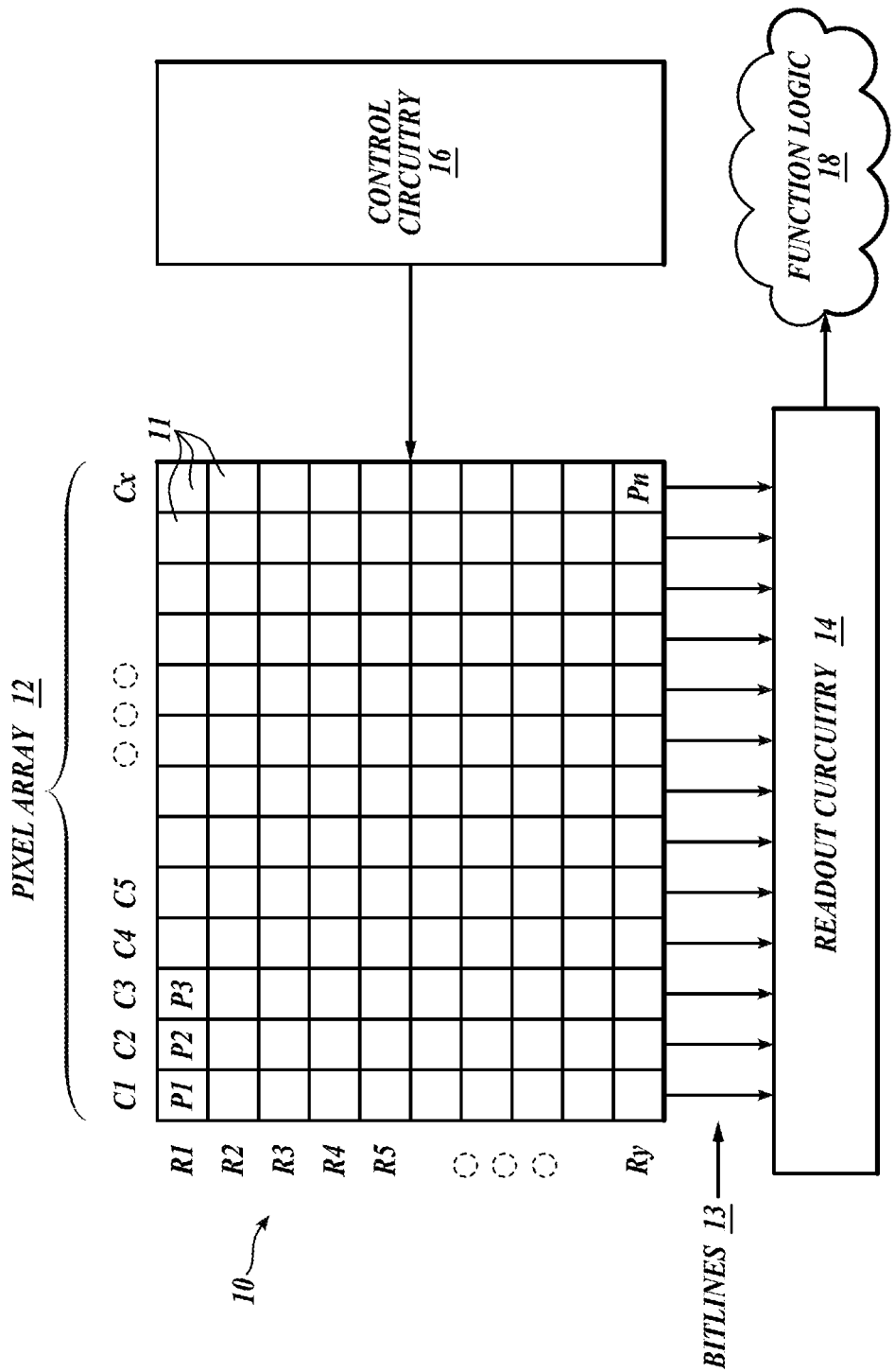
FIG. 1 is a diagram of an example image sensor in accordance with an embodiment of the present technology.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors, and in particular, complementary metal oxide semiconductor (CMOS) having multiple sensitivities that are suitable for high dynamic range imaging and light emitting diode (LED) flicker mitigation are disclosed. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

From the foregoing, it will be appreciated that specific embodiments of the technology have been described herein for purposes of illustration, but that various modifications may be made without deviating from the disclosure. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Where methods are described, the methods may include more, fewer, or other steps. Additionally, steps may be performed in any suitable order. Accordingly, the disclosure can encompass other embodiments not expressly shown or described herein. In the context of this disclosure, the term "about" means+/−5% of the stated value.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, the embodiments of the present technology are directed to CMOS image sensor having pixels with multiple sensitivities. In some embodiments, individual pixels of the image sensor may be subdivided into subpixels, each having one or more photo diodes. Light sensitivity, and therefore dynamic range, of these subpixels may be individually adjusted through their corresponding color filters. As a non-limiting example, an individual pixel (e.g., a green pixel) may be subdivided into 16 subpixels, out of which 12 have transparent color filters (or weak color filters), while the remaining 4 subpixels have individual color filters of different strength. Therefore, such sample individual pixel includes a total of 5 color filters of differing filtering strength. In the context of this specification, a "weak" color filter (or "less dark" color filter) means a color filter that filters out a relatively low amount of incoming light, and a "strong" color filter (or "darker" color filter) means a color filter that filters out a relatively high amount of incoming light. For example, a weak filter may be a transparent filter or the one that blocks 5-10% of the incoming light of particular color (for a given color of the filter), while a strong filter may block 70-90% of the incoming light of particular color. As another example, a weak filter may be transparent filter or may block 5-20% of the incoming light of particular color, while a strong filter may block 60-90% of the incoming light of particular color. As yet another example, a weak filter may be a transparent filter or may block 10-20% of the incoming light of particular color, while a strong filer may block 80-95% of the incoming light of particular color. Other examples are also possible in different embodiments. For a given pixel, the remaining color filters (e.g., the remaining 3 color filters from the above sample group of 4 "darker color filters") have filtering strength somewhere on a scale between the "weak" and "strong" filters. Such filters having different filtering strength may be referred to as a first filter, a second filter, a third filter, etc., when describing different embodiments.

As another nonlimiting example of dividing a pixel into subpixels, an individual pixel (e.g., a blue pixel) may be subdivided into 9 subpixels, out of which 6 have a transparent color filter (or have a weak color filter), while the remaining 3 subpixels have individual color filters of different strength, for a total of 4 color filters of different strength. In different embodiments, other combinations of subpixels and color filters are also possible. In some embodiments, color filters may be referred to as neutral density (ND) filters. In some embodiments, the transparent filters may be omitted from the image sensor.

In operation, the subpixels exhibit different dynamic ranges (also referred to as "sensitivities") depending on the strength of their corresponding color filters. For example, the subpixels having stronger color filters have correspondingly higher dynamic range of operation, and vice versa. Therefore, at least some subpixels in each pixel may remain unsaturated even when capturing images that are characterized by high dynamic ranges. Conversely, when capturing images that cause relatively low exposure of the image sensor, at least some subpixels may remain well exposed, in particular those pixels that are characterized by transparent or weak color filters. Therefore, in at least some embodiments, an acceptable image may be obtained in a single exposure, without resorting to multiple exposures that are susceptible to motion artifacts and LED flickering. Furthermore, pixel's signal-to-noise ratio (SNR) may remain at acceptable level during such "single exposure" capture of the image.

FIG. 1 is a diagram of an example image sensor 10 in accordance with an embodiment of the present technology. The image sensor 10 includes a pixel array 12, a control circuitry 16, a readout circuitry 14 and a function logic 18. In one example, the pixel array 12 is a two-dimensional (2D) array of photodiodes or image sensor pixels 11 (e.g., pixels P1, P2 . . . , Pn). In different embodiments, two or more image sensor pixels 11 may be grouped to a plurality of pixel cells. As illustrated, the photodiodes are arranged into rows (e.g., rows R1 to Ry) and columns (e.g., columns C1 to Cx). In operation, the photodiodes acquire image data of a scene, which can then be used to render a 2D image of person, place, object, etc. However, in other embodiments the photodiodes may be arranged into configurations other than rows and columns.

In an embodiment, after each pixel 11 in the pixel array 12 acquires its image charge, the image data is read out by the readout circuitry 14 via bitlines 13, and then transferred to a function logic 18. The readout image data of each pixel 11 collectively constitute an image frame. In various embodiments, the readout circuitry 14 may include signal amplifiers, analog-to-digital (ADC) conversion circuitry and data transmission circuitry. The function logic 18 may store the image data or even manipulate the image data by applying post image effects (e.g., crop, rotate, remove red eye, adjust brightness, adjust contrast, or otherwise). In some embodiments, the control circuitry 16 and function logic 18 may be combined into a single functional block to control the capture of images by the pixels 11 and the readout of image data from the readout circuitry 14. The function logic 18 may include a digital processor. In an embodiment, the readout circuitry 14 may read one row of image data at a time along readout column lines (bitlines 13) or may read the image data using a variety of other techniques, such as a serial readout or a full parallel readout of all pixels simultaneously.

In one embodiment, the control circuitry 16 is coupled to the pixel array 12 to control operation of the plurality of photodiodes in the pixel array 12. For example, the control circuitry 16 may generate a shutter signal for controlling image acquisition. In one embodiment, the shutter signal is a global shutter signal for simultaneously enabling all pixels within the pixel array 12 to simultaneously capture their respective image data during a single data acquisition window. In another embodiment, the shutter signal is a rolling shutter signal such that each row, column or group of pixels is sequentially enabled during consecutive acquisition windows. In another embodiment, image acquisition is synchronized with lighting effects such as a flash. In different embodiments, the control circuitry 16 may be configured to control each of pixels 11 to perform the acquiring operations of one or more dark current pixel frames for image calibration and normal image frames.

In one embodiment, readout circuitry 14 includes analog-to-digital converters (ADCs), which convert analog image data received from the pixel array 12 into a digital representation. The digital representation of the image data may be provided to the function logic 18.

In different embodiments, image sensor 10 may be part of a digital camera, cell phone, laptop computer, or the like. Additionally, image sensor 10 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to the image sensor 10, extract image data from the image sensor 10, or manipulate image data supplied by image sensor 10.

Voltage values of the individual pixels ($P_1$-$P_n$) can be captured by the readout circuitry 14. For example, a control circuitry 16 may determine a specific row $R_i$ of the pixel array 12 for coupling with the readout circuitry 14. After the pixel values in row $R_i$ are captured, the control circuitry 16 may couple row $R_{i+1}$ with the readout circuitry 14, and the process repeats until voltage values of all the pixels in the column are captured. In other embodiments, the readout circuitry 14 may readout the image data using a variety of other techniques (not illustrated in FIG. 1), such as a serial readout or a full parallel readout of all pixels simultaneously. In different embodiments, the readout circuitry 14 may include amplification circuitry, analog-to-digital conversion ("ADC") circuitry, or other circuitry. In some embodiments, the pixel values are captured and processed by the function logic 18. Such processing may, for example, include image processing, image filtering, image extraction and manipulation, determination of light intensity, etc.

Figure 2:
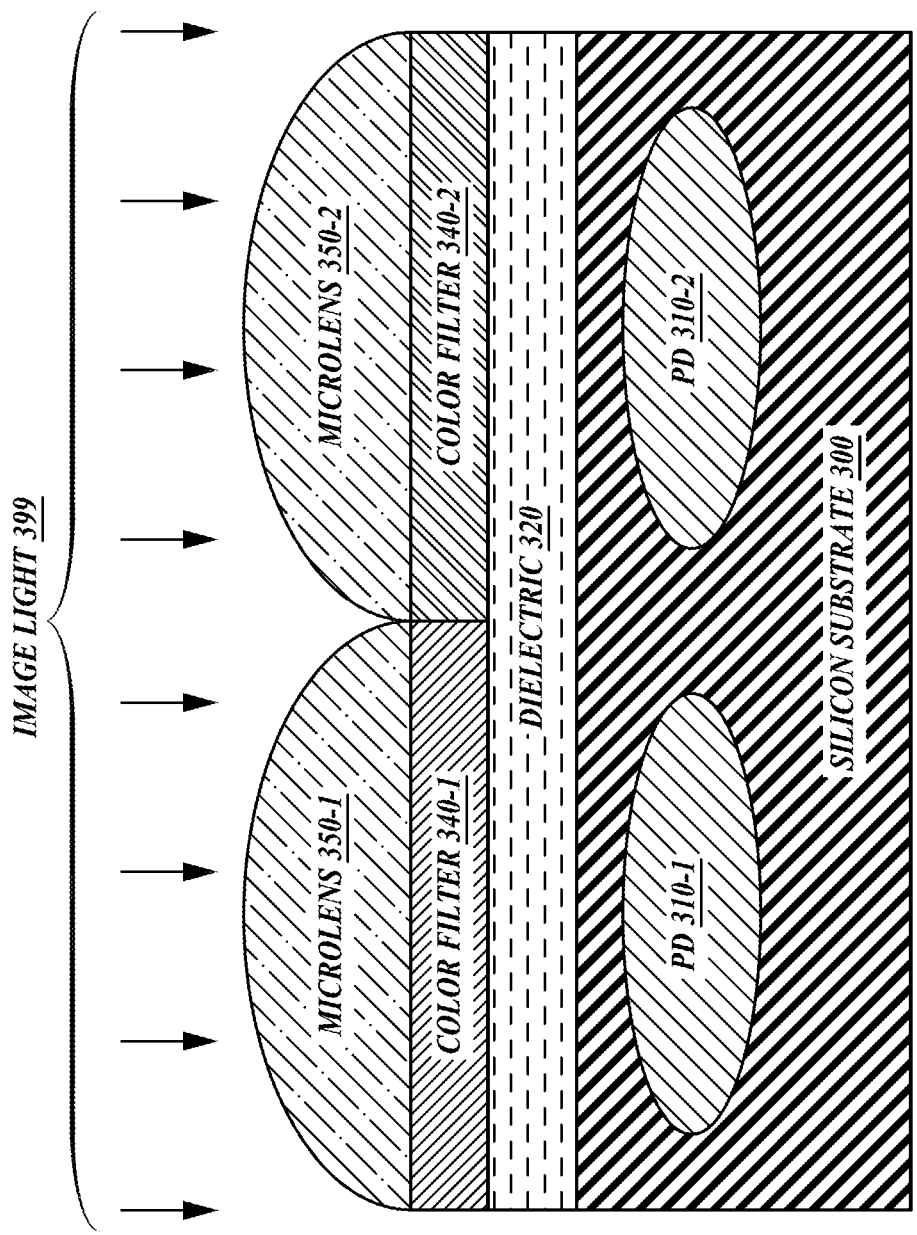
FIG. 2 is a cross-sectional view of an example image sensor in accordance with an embodiment of the present technology.

FIG. 2 is a cross-sectional view of an example image sensor in accordance with an embodiment of the present technology. Two photodiodes 310-1 and 310-2 are illustrated for simplicity. Generally, an image sensor includes many pixels, and each pixel may include multiple photodiodes. For example, the photodiodes 310-1 and 310-2 (also referred to as "cells" or "subpixels") may constitute one pixel. In the illustrated embodiment, a first photodiode (PD) 310-1 may be configured to capture low light and a second photodiode 310-2 may be configured to capture bright light as explained in more detailed below.

In the illustrated embodiment, a first microlens 350-1 and a first color filter 340-1 are stacked over the first photodiode 310-1. A second microlens 350-2 and a second color filter 340-2 are stacked over the second photodiode 310-2. The photodiodes 310-1 and 310-2 may be disposed in a silicon substrate 300. The first photodiode 310-1 and second photodiode 310-2 are both disposed in the same semiconductor material, which is illustrated as silicon substrate 300. The first photodiode 310-1 and second photodiode 310-2 may be of same size and have same dopant concentrations, resulting in the same full well capacity. In one embodiment, the first photodiode 310-1 and the second photodiode 310-2 have the same light exposure area, where the light exposure area is defined as the area of the photodiode viewed looking down at the photodiode through the center of its corresponding microlens. Color filters 340 pass a specific color of image light 399 (e.g., red, green, or blue) while substantially blocking the image light that is different than the specific filter color. A dielectric layer 320 is disposed between silicon substrate 300 and color filters 340. The dielectric layer 320 may include Low-Pressure Chemical Vapor Deposition ("LPCVD") silicon dioxide or spun-on silicon dioxide.

In operation, the first microlens 350-1 directs the incoming image light 399 through the first color filter 340-1 toward the first photodiode 310-1. The second microlens 350-2 and the second color filter 340-2 are stacked over the second photodiode 310-2. In the illustrated example, the color filter 340-1 is more transmissive (letting more visible light through) than the color filter 340-2. As a result, the photodiode 310-2 receives less image light 399 than the first photodiode 310-1 during the same exposure.

In an embodiment, color filters 340 are formed as a layer of metal that is approximately fifty nanometers thick. In one embodiment, the material of color filters 340 includes a transparent photoresist that is impacted by a plasma of Nitrogen atoms to reduce transparency of the material. Although the color filters 340-1 and 340-2 are illustrated as having the same thickness, the color filter 340-2 may be thicker than the color filter 340-1, therefore blocking more light by virtue of having increased height. In this case, a clear planarizing layer that does not block light may be added to the top or bottom of the color filter 340-1 to support the first microlens 350-1 at the same elevation as the second microlens 350-22. In an embodiment, the color filters 340-1 and 340-2 are made of the same material, except that the color filter 340-1 has an array of micro slits or holes that run through all or a portion of the thickness of the transparent material so that more image light 399 is passed through the color filter 340-1 than is passed through the color filter 340-2. In yet another embodiment, the color filters 340-1 and 340-2 are made from polytetrafluoroethylene ("PTFE") that includes additives (e.g., titanium dioxide) to adjust transparency as desired. In the context of this specification, term "color filter" encompasses both color filters and gray scale filters.

Figure 3A:
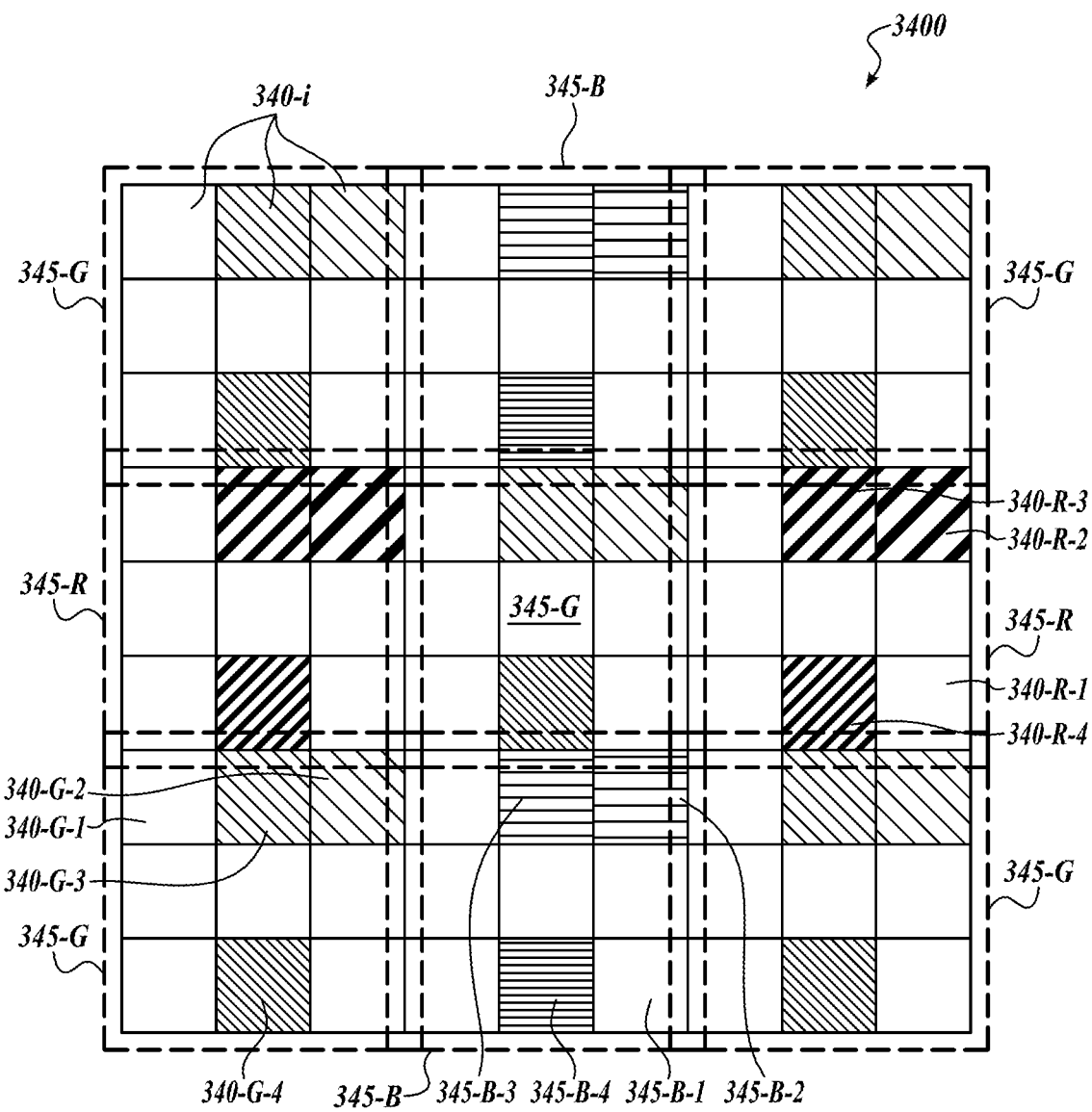
FIGS. 3A-3C are top schematic views of color filter arrangements in accordance with an embodiment of the present technology.
Figure 3B:
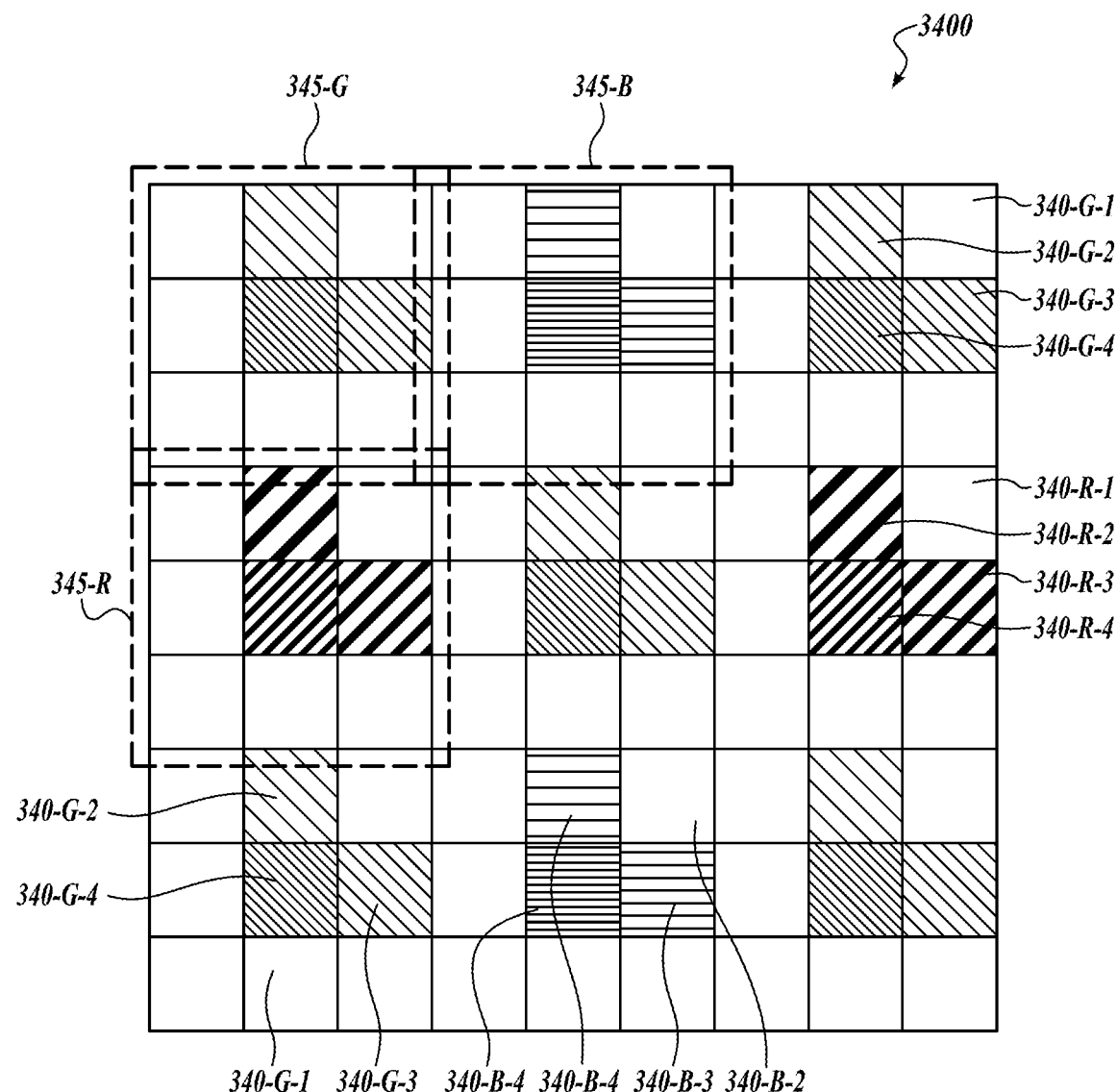
Figure 3C:
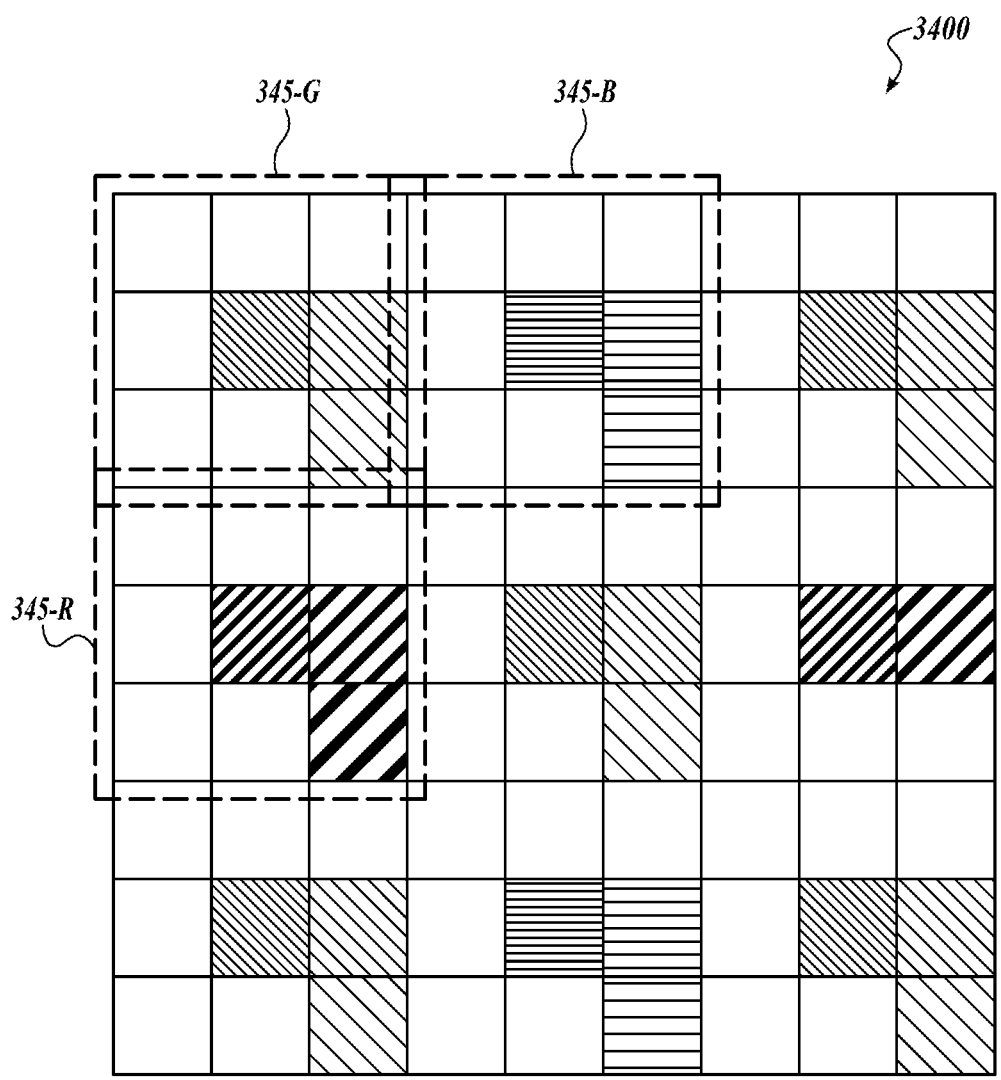

FIGS. 3A-3C are top schematic views of color filter arrangements 3400 in accordance with an embodiment of the present technology. Each of the illustrated arrangements in FIGS. 3A-3C includes a 3×3 array of groups of color filters 345 corresponding to pixels of an image sensor. Groups 345 may correspond to pixels of different colors, for example, green, red and blue pixels having their corresponding groups of color filters designated as 345-G, 345-R and 345-B, respectively. Each illustrated group of color filters 345 (e.g., 345-G, 345-B, etc.) includes a 3×3 array of color filters that are enumerated as, for example, 340-G-1, 340-G-2, 340-G-3 and 340-G-4 for the group 345-G, and also analogously enumerated for the groups 345-B and 345-R. For simplicity, the individual color filters may be referred to with designation 340-$i$ elsewhere in the specification. Other numbers of pixels in the image sensor and/or pixel color filters per individual pixel are also encompassed by this specification, some examples of which are discussed below with respect to different Figures in the specification. As explained above, in some embodiments, an individual cell (subpixel) 340-$i$ may correspond to an individual photodiode. In other embodiments, an individual cell 340-$i$ may correspond to several photodiodes.

Still referring to FIGS. 3A-3C, each illustrated group of color filters (e.g., 345-G, 345-B, 345-R) includes color filters of 4 different strengths for each respective color. For instance, 4 different filtering strengths for the green color filters of group 345-G, 4 different filtering strengths for the blue color filters of group 345-B, and 4 different filtering strengths for the red color filters of group 345-R. The increasing filtering strength (also referred to as "darkness") of the color filters is represented by an increased density of hatching. For example, a color filter 340-R-1 represents a transparent or weak red color filter, and a color filter 340-R-4 represents the strongest (darkest) red color filter in the group 345-R. Filtering strength of the color filters 340-R-2 and 340-R-3 is between those of the color filters 340-R-1 and 340-R-4. Analogous hatching scheme is used for the groups of blue color filters 345-B and green color filters 345-G. In other embodiments, different gradations of color filters may be used. In the illustrated embodiment, each group of color filters (e.g., 345-G, 345-B, 345-R) includes 6 transparent (or weak) color filters and 3 filters with increasing filtering strengths for each color. In different embodiments, different distributions of color filter strengths may be used. For example, for the 3×3 groups of color filters (corresponding to one pixel), 5 cells may have transparent or weak color filters, while the remaining cells have color filters of differing strengths for each respective color.

FIGS. 3A-3C illustrate different distributions of color filters within each group of color filters. In these embodiments, a distribution of the color filters remains the same from one group of color filters (e.g., 345-G) to other groups of color filters (e.g., 345-B, 345-R). Referring to FIG. 3A, the color filters having higher filtering strengths (e.g., 340-G-2, 340-G-3, 340-G-4) are distributed within upper and lower rows of a given group of color filters (e.g., 345-G). Referring to FIGS. 3B and 3C, the color filters having higher filtering strengths are distributed more centrally with respect to their group, such that the color filters having higher filtering strengths are surrounded by the transparent/weak color filters.

Figure 4A:
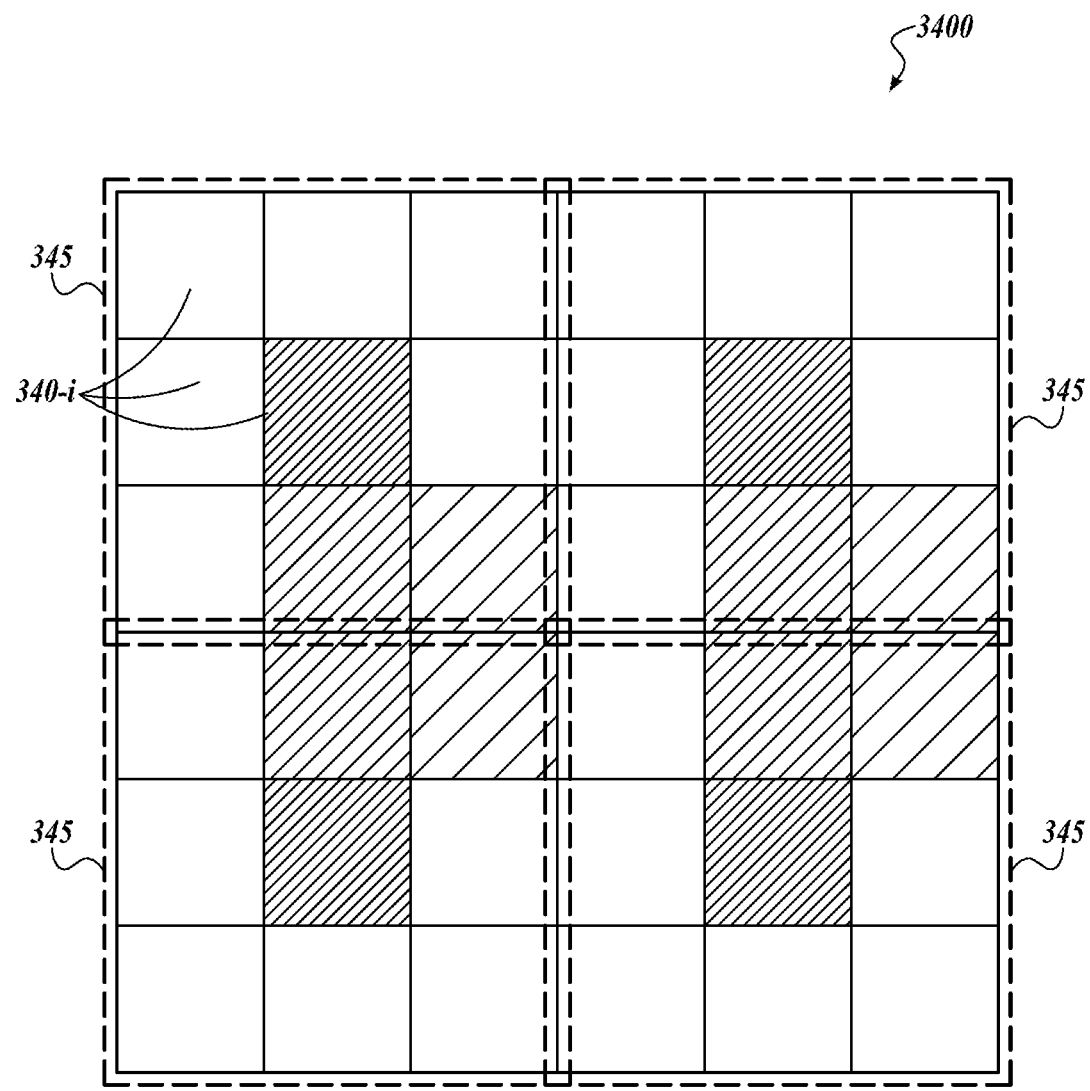
FIGS. 4A-4C are top schematic views of color filter arrangements in accordance with an embodiment of the present technology.
Figure 4B:
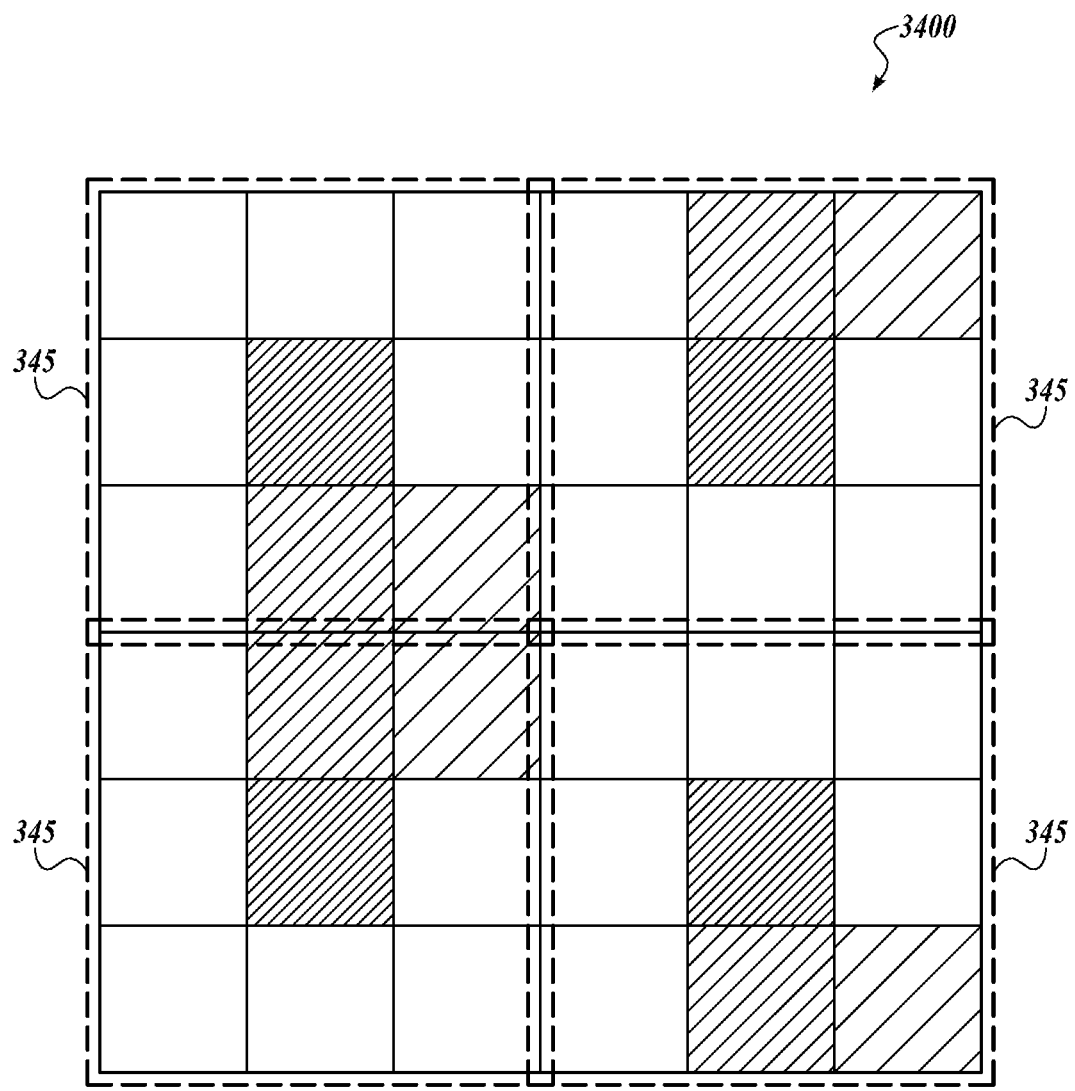
Figure 4C:
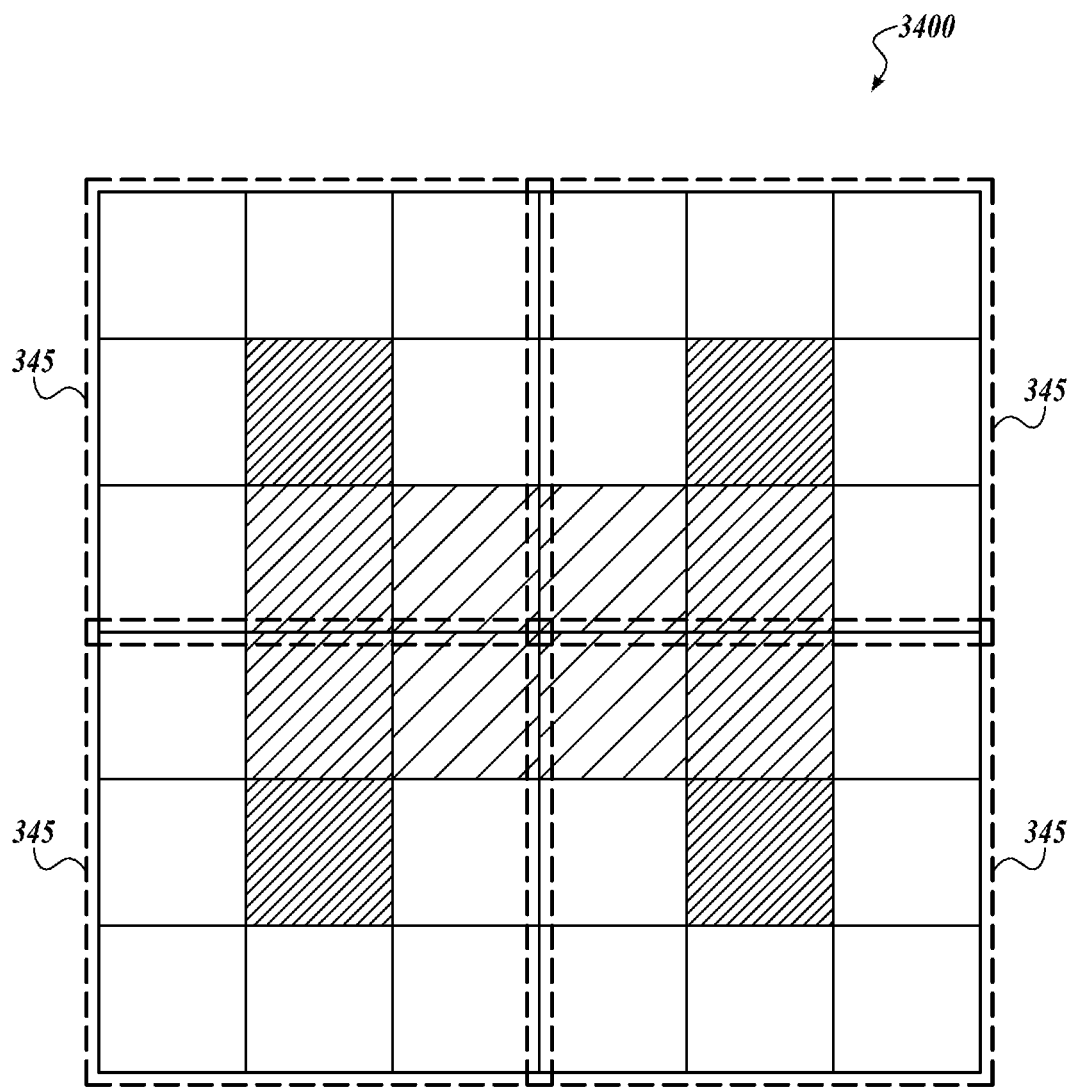

FIGS. 4A-4C illustrate different distributions of color filters within each group of color filters. The illustrated embodiments represent grey pixels and the corresponding grey scale color filters. As explained above, denser hatching indicates higher filtering strength. Each grey pixel in the arrangement 3400 includes 3×3 cells (subpixels or photodiodes). In the illustrated groups, 6 cells have transparent/weak color filters, while 3 cells have filters of increasing filtering strength. In other embodiments, different distributions of color filters' filtering strength may be used.

In FIGS. 4A-4C, distribution of the color filters differs from one group of color filters 345 to another group 345. Referring to FIG. 4A, the color filters 340-*i* having higher filtering strengths are arranged evenly within individual color filter groups 345, and generally adjacent along horizontal borders between the groups 345. Referring to FIG. 4B, the color filters having higher filtering strengths are distributed unevenly within their corresponding groups of color filters 345 (e.g., in the middle of the corresponding group of 4 pixels). Referring to FIG. 4C, the color filters having higher filtering strengths are clustered in the middle of the corresponding group of color filters 345 (e.g., in the middle of the corresponding group of 4 pixels). In some embodiments, such adjacent location of the color filters having higher filtering strengths may reduce the amount of stray light received by the cells (subpixels) having the color filters with higher filtering strength, therefore reducing the crosstalk.

Figure 5A:
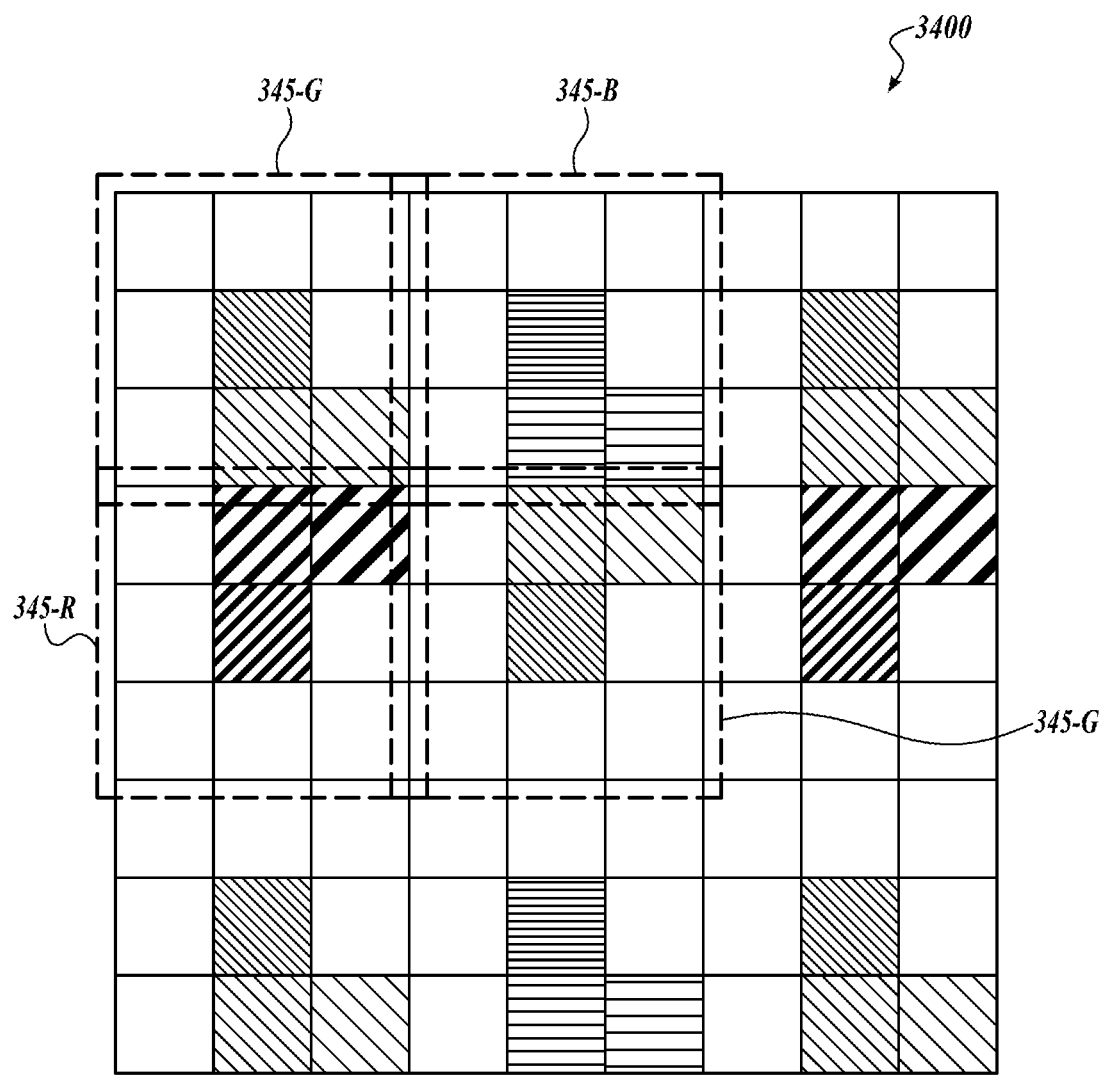
FIGS. 5A and 5B are top schematic views of color filter arrangements in accordance with an embodiment of the present technology.
Figure 5B:
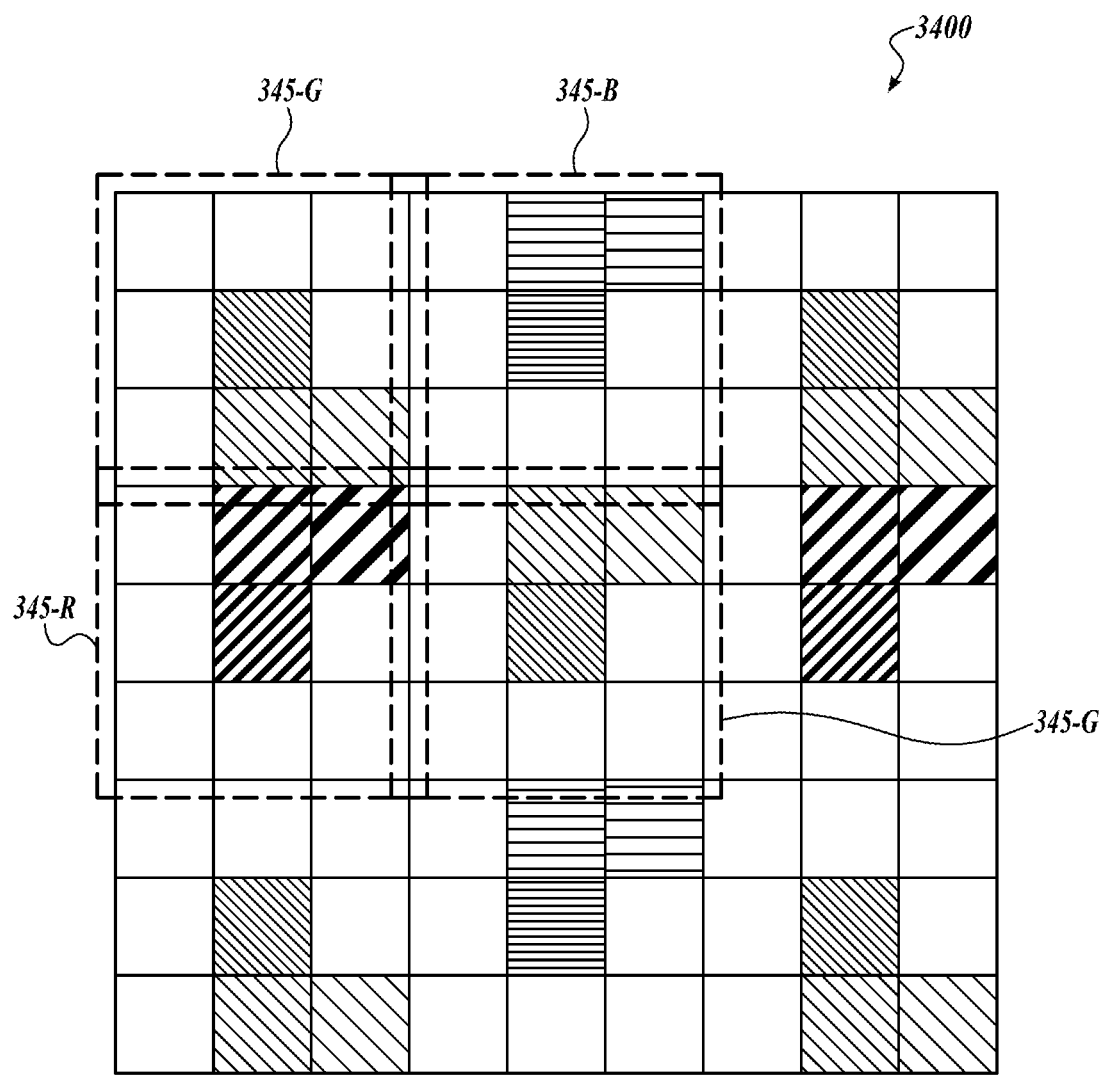

FIGS. 5A and 5B are top schematic views of color filter arrangements in accordance with an embodiment of the present technology. As in prior examples, density of hatching of the color filters represents their corresponding filtering strength. In different embodiments, the distribution of color filters within a given group of color filters 345 may be different. FIG. 5A illustrates a so-called "even" distribution where within each row of pixels (corresponding to the row of group of color filters 345), the distribution of the color filter strengths is the same for every group of color filters 345. For example, sample pixels in the upper row include the same distribution of color filter strengths for the illustrated groups 345-G and 345-B. On the other hand, FIG. 5B illustrates a so-called "uneven" distribution. Looking again at the upper row of pixels, the distribution of color filter strengths for the groups 345-G and 345-B is different. In different embodiments, even or uneven distributions may regulate crosstalk between the groups or between the individual cells within a group.

Figure 6A:
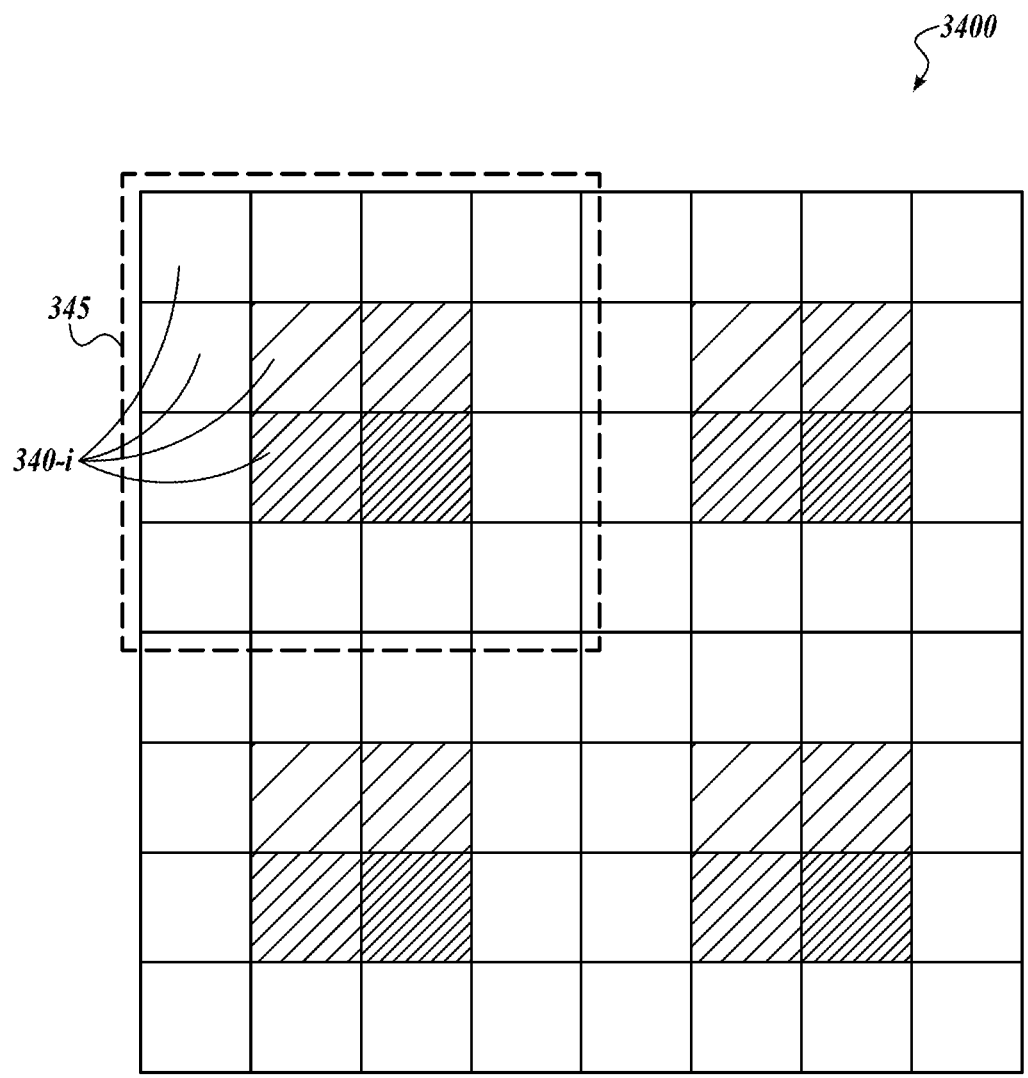
FIGS. 6A and 6B are top schematic views of color filter arrangements in accordance with an embodiment of the present technology.
Figure 6B:
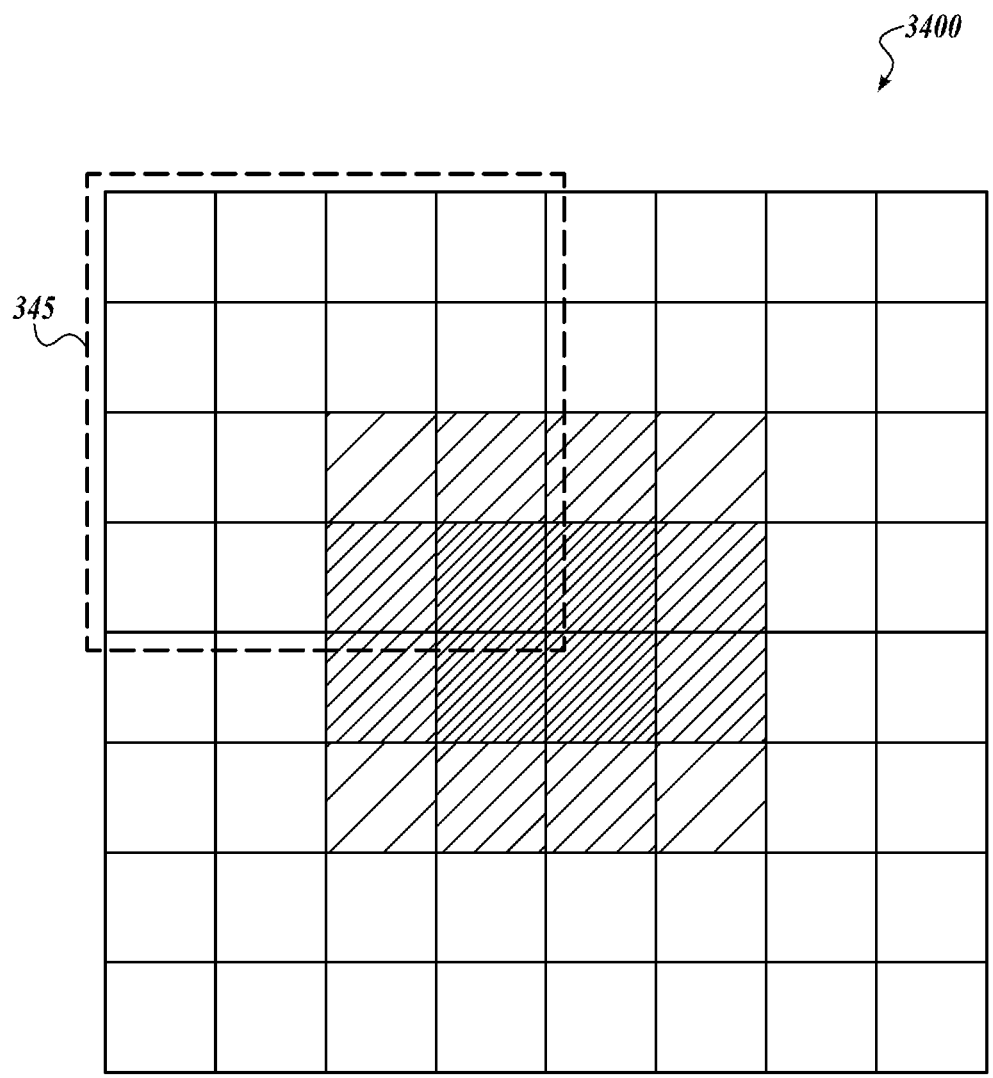

FIGS. 6A and 6B are top schematic views of color filter arrangements in accordance with an embodiment of the present technology. Here, each group of color filters 345 includes a 4×4 array of color filters that are enumerated as 340-*i* for simplicity. As explained above, the term "color filter" applies to both color and grayscale filters in context of this specification. Within the 4×4 groups of color filters (corresponding to a pixel), 12 cells (subpixels, photodiodes) have color filters that are transparent or relatively weak, and 4 cells have color filters with increasing color filtering strength. In other embodiments, other ratios of weak/strong color filters are also possible.

FIG. 6A illustrates an embodiment where the cells having relatively strong filtering strength are clustered in the middle of the pixel. Such an arrangement may promote a relatively even response of individual pixels. FIG. 6B illustrates an embodiment where the cells having relatively strong filtering strength are adjacent to each other (e.g., clustered as a group) for different pixels. Such an arrangement may reduce crosstalk among the pixels by reducing the amount of light that reflects from one pixel to another. In general, the color filters of higher filtering strength also reduce the stray light into adjacent cells, therefore reducing the crosstalk among the pixels.

Figure 7A:
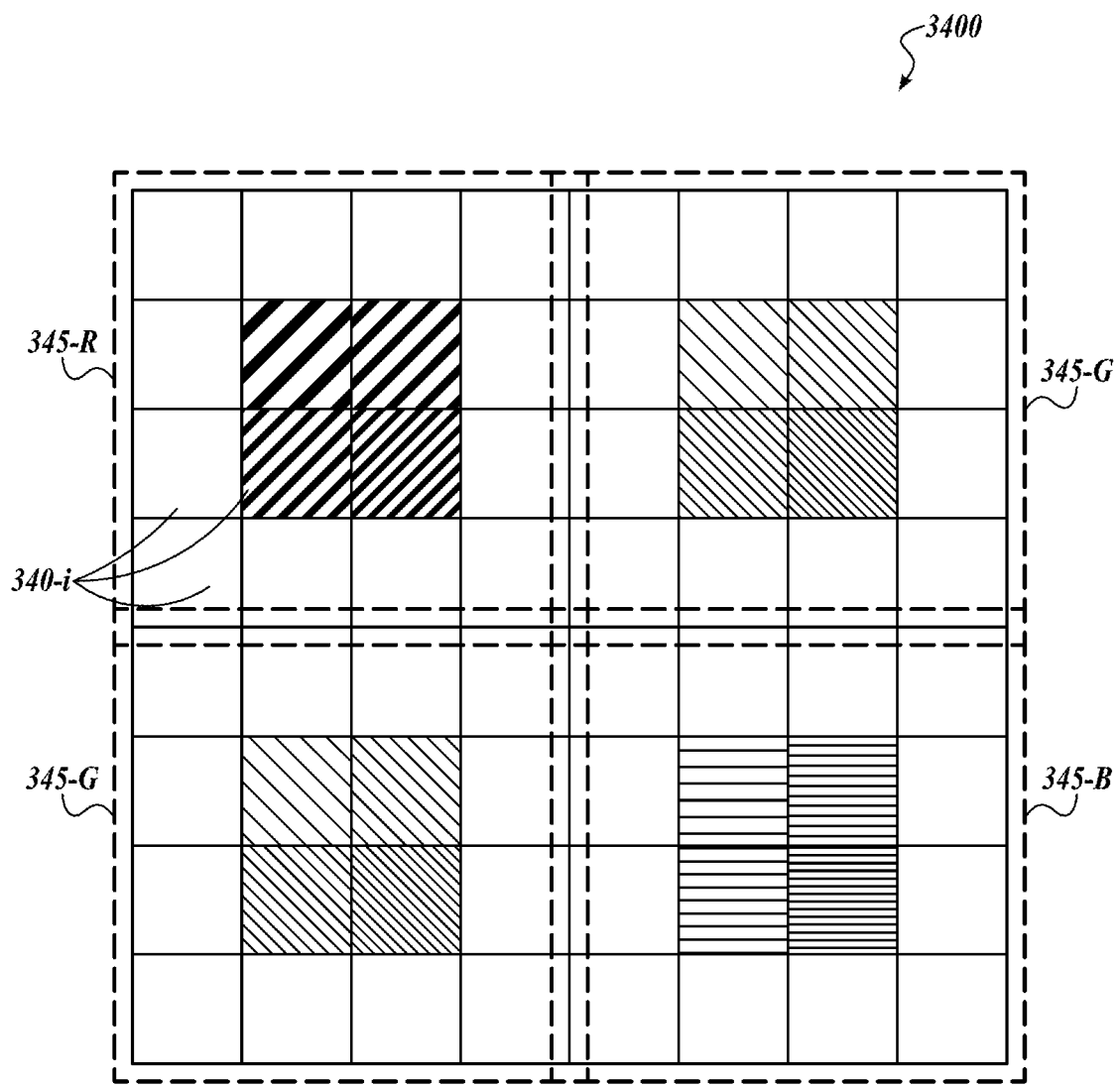
FIGS. 7A-7C are top schematic views of color filter arrangements in accordance with an embodiment of the present technology.
Figure 7B:
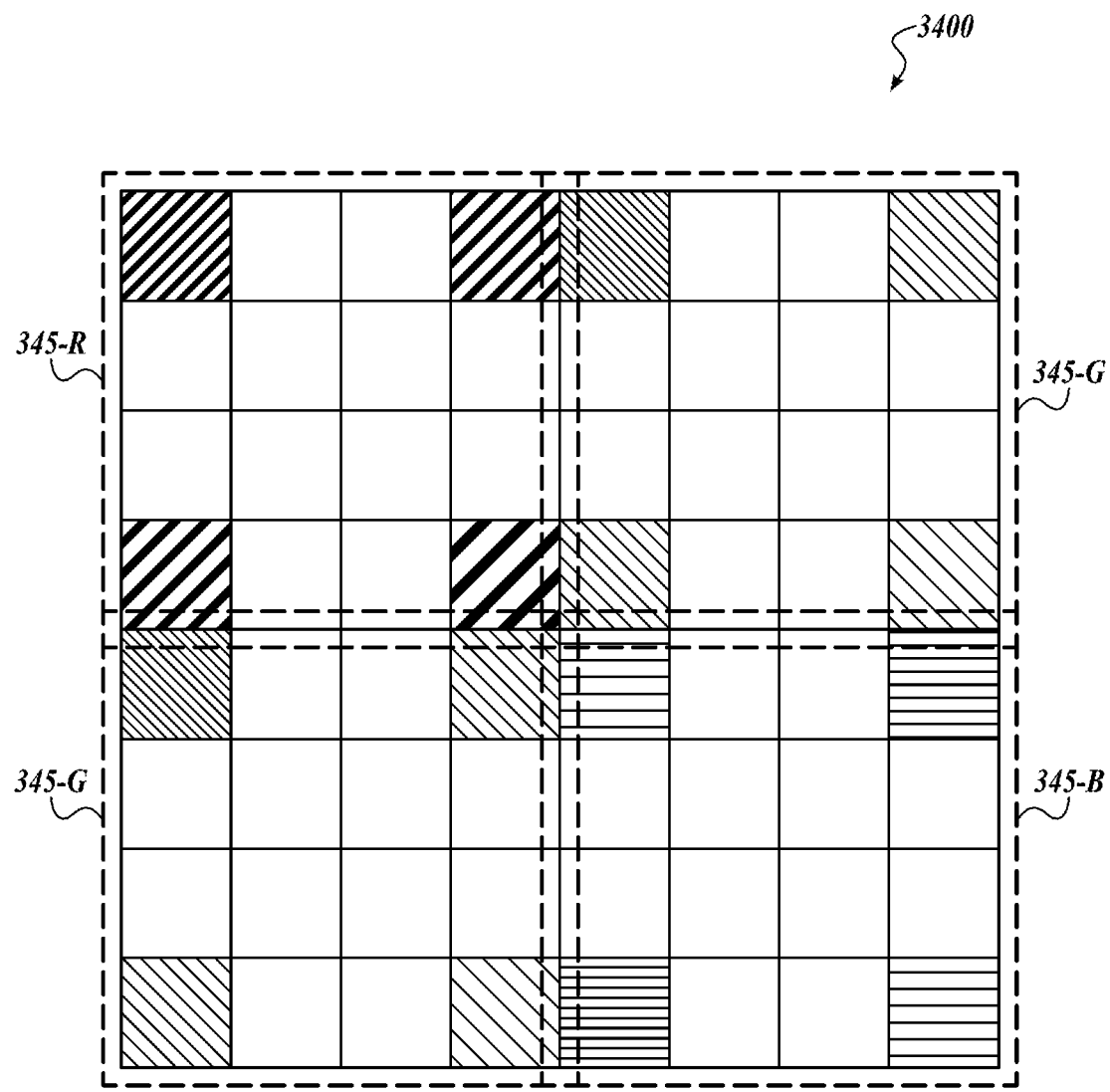
Figure 7C:
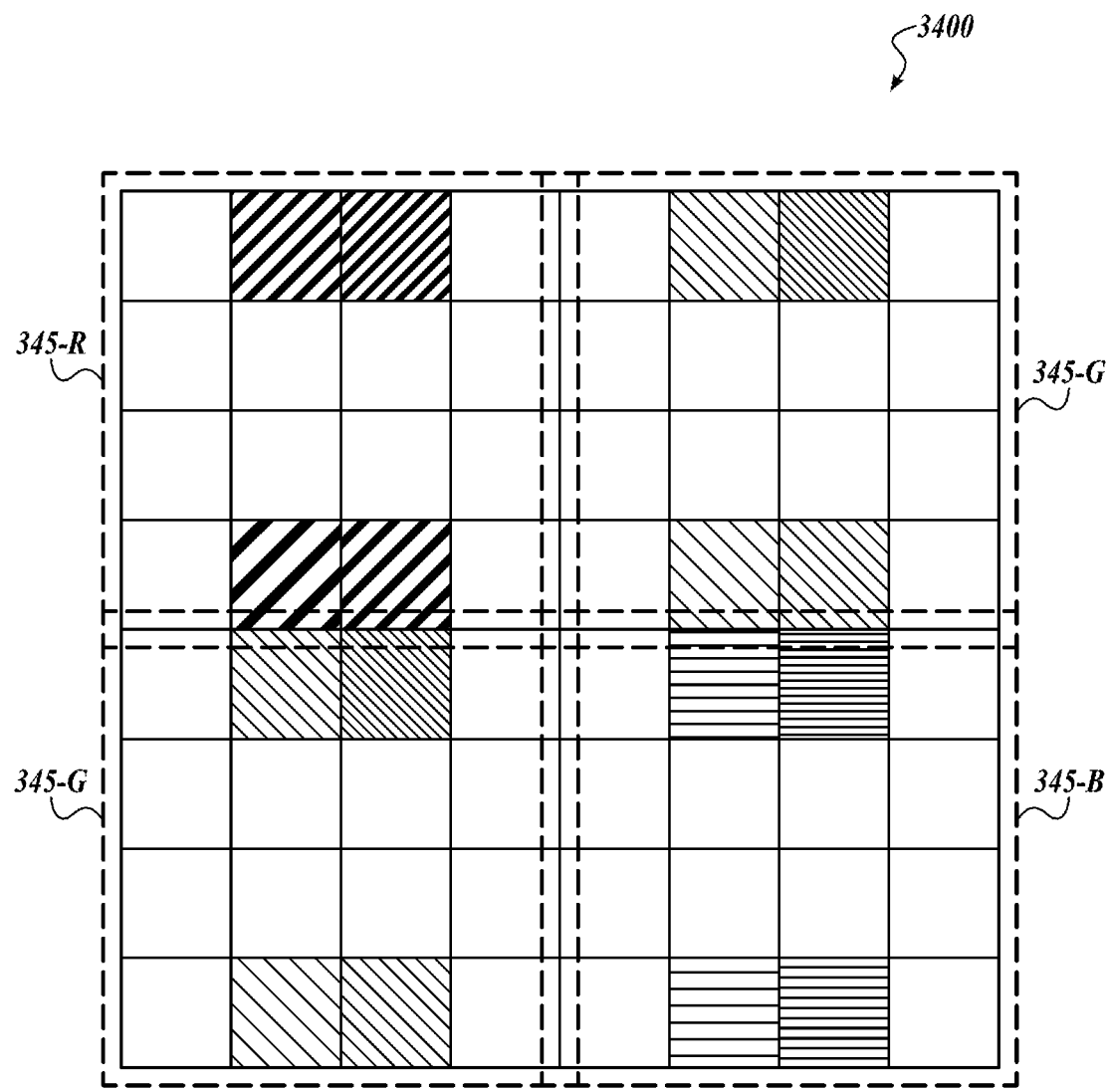

FIGS. 7A-7C are top schematic views of color filter arrangements in accordance with an embodiment of the present technology. The embodiment illustrated in FIG. 7A is comparable to the one illustrated in FIG. 6A, therefore promoting an even response of the pixels and improved spatial sampling over the area of the pixel. In the embodiments illustrated in FIGS. 7B and 7C, the cells having color filters with relatively strong filtering strength are distributed to face the corresponding cells from the adjacent pixel. Such an arrangement of cells reduces crosstalk among pixels along multiple borders of a given pixel. In comparison to the arrangement illustrated in FIG. 6B, the arrangement illustrated in FIGS. 7B and 7C reduce crosstalk along more cells, but not as significantly as a concentration of cells having color filters with relatively strong filtering strength does in FIG. 6B.

Figure 8A:
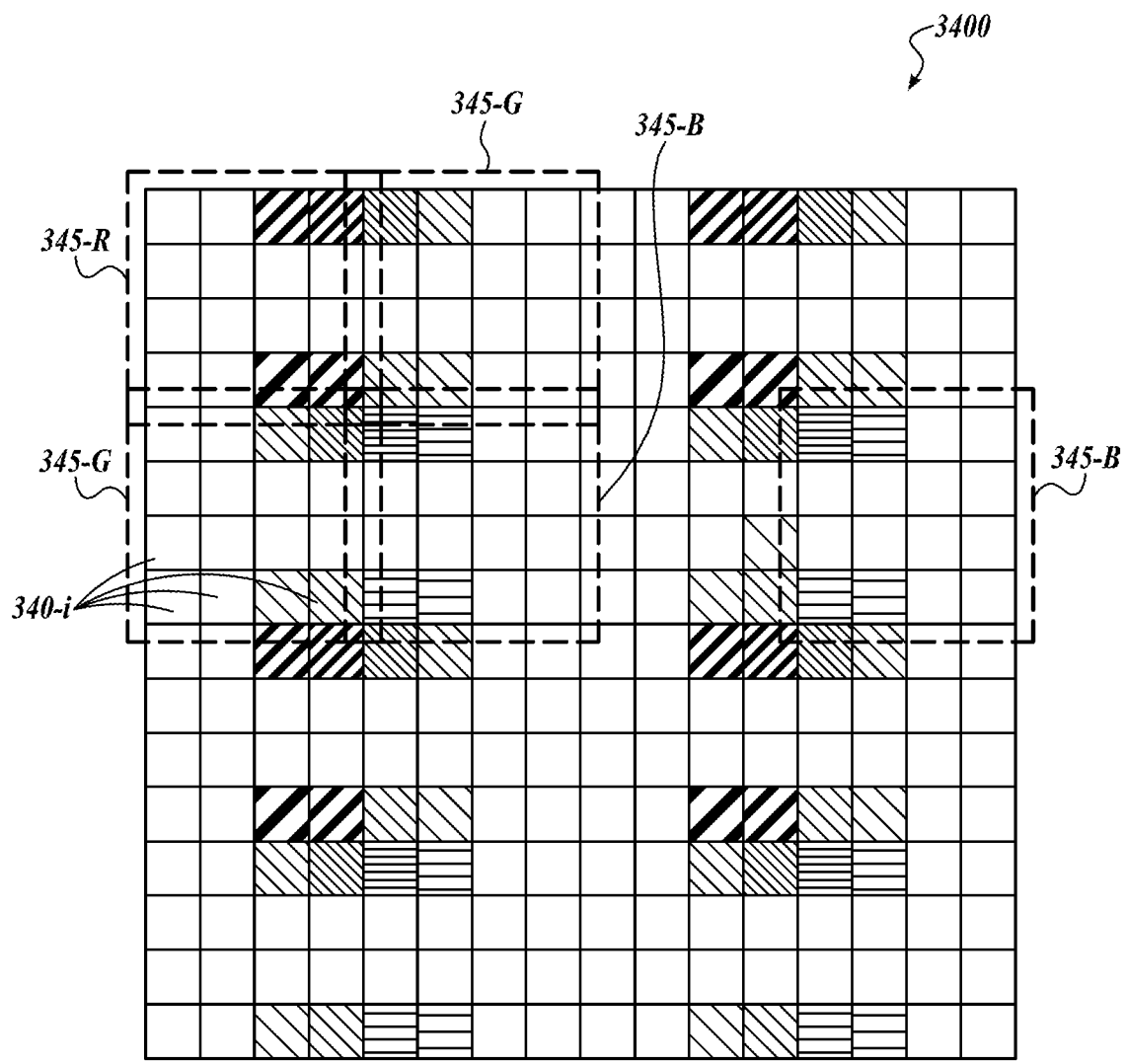
FIGS. 8A and 8B are top schematic views of color filter arrangements in accordance with an embodiment of the present technology.
Figure 8B:
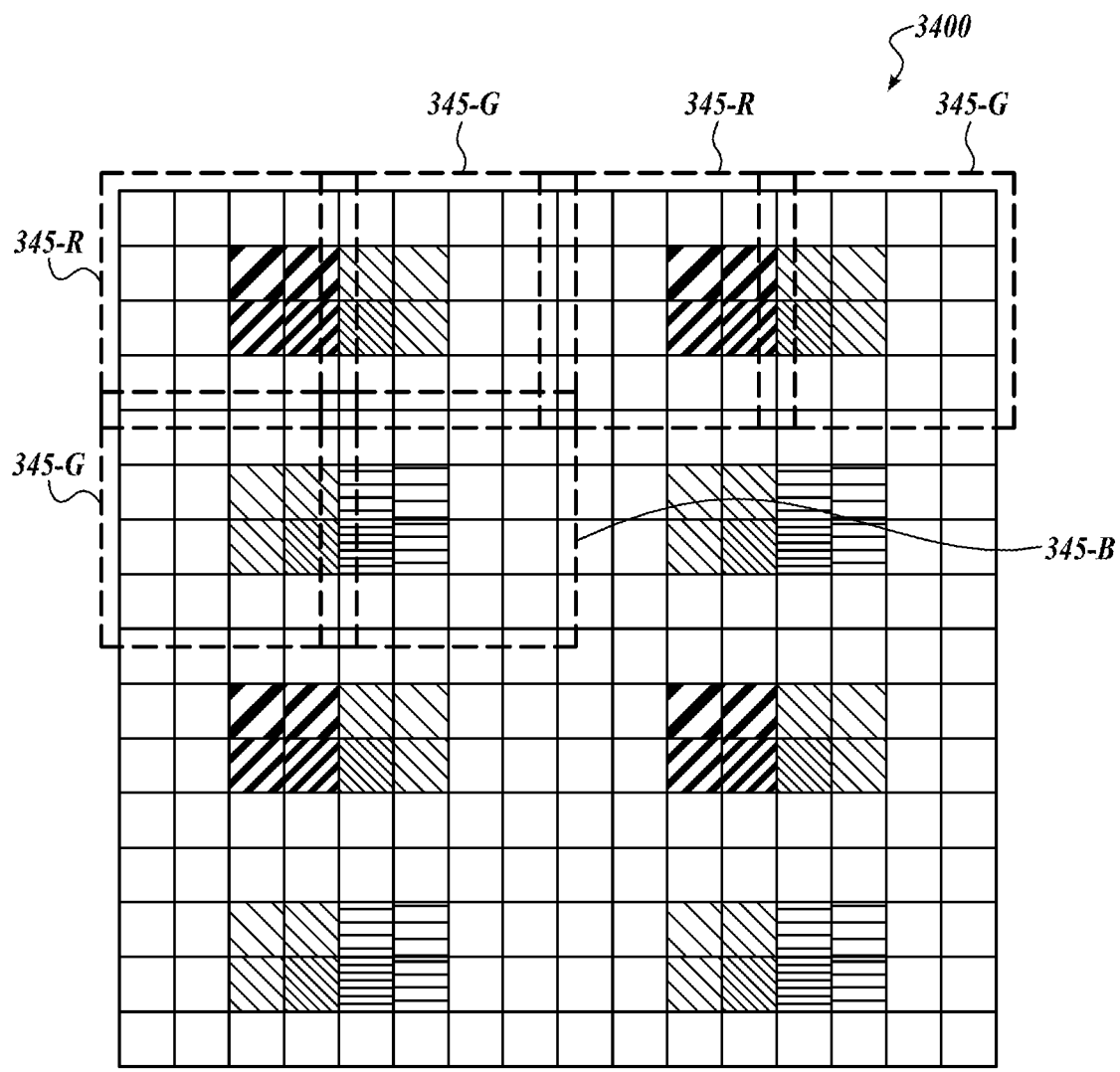

FIGS. 8A and 8B are top schematic views of color filter arrangements in accordance with an embodiment of the present technology. Both illustrated embodiments depict cells having relatively strong filtering strength being adjacent to each other for different pixels. FIG. 8A illustrates an embodiment where the cells having relatively strong filtering strength are adjacent diagonally. FIG. 8B illustrates an embodiment where the cells having relatively strong filtering strength are adjacent to each other laterally. In both arrangements, crosstalk among the cells is reduced.

Many embodiments of the technology described above may take the form of computer- or controller-executable instructions, including routines executed by a programmable computer or controller. Those skilled in the relevant art will appreciate that the technology can be practiced on computer/ controller systems other than those shown and described above. The technology can be embodied in a special-purpose computer, application specific integrated circuit (ASIC), controller or data processor that is specifically programmed, configured or constructed to perform one or more of the computer-executable instructions described above. Of course, any logic or algorithm described herein can be implemented in software or hardware, or a combination of software and hardware.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a plurality of pixels arranged in rows and columns of a pixel array that is disposed in a semiconductor substrate, wherein each pixel comprises a plurality of cells; and
   a plurality of color filters disposed over corresponding plurality of cells;
   wherein the plurality of color filters corresponding to the plurality of cells of an individual pixel have more than one filtering strength for each color of the plurality of color filters,
   wherein the plurality of color filters corresponding to the plurality of cells of the individual pixel is a first plurality of color filters of a first pixel, wherein the first plurality of color filters comprises at least one first dark color filter and at least one first transparent color filter, the image sensor further comprising a second plurality of color filters disposed over corresponding second plurality of cells of a second individual pixel, wherein the second plurality of color filters comprises at least one second dark color filter and at least one second transparent color filter,
   a third plurality of color filters disposed over corresponding third plurality of cells of a third individual pixel, wherein the third plurality of color filters comprises at least one third dark color filter and at least one third transparent color filter, and
   a fourth plurality of color filters disposed over corresponding fourth plurality of cells of a fourth individual pixel, wherein the fourth plurality of color filters comprises at least one fourth dark color filter and at least one fourth transparent color filter,
   wherein a crosstalk between the first pixel, the second pixel, the third pixel and the fourth pixel is reduced by the first dark color filter, the second dark color filter, the third dark color filter, and the fourth dark color filter being adjacent to each other.

2. The image sensor of claim 1, wherein the plurality of color filters are neutral density color filters.

3. The image sensor of claim 2, wherein the at least one dark color filter comprises color filters of differing filtering strengths.

4. The image sensor of claim 1, wherein the at least one first dark color filter is laterally adjacent to the at least one second dark color filter.

5. The image sensor of claim 1, wherein the at least one first dark color filter is diagonally adjacent to the at least one second dark color filter.

6. The image sensor of claim 1, wherein the at least one transparent color filter is adjacent to the at least one second transparent color filter.

7. The image sensor of claim 1, wherein a plurality of transparent color filters of the first pixel are adjacent to a plurality of transparent color filters of the second pixel.

8. The image sensor of claim 1, wherein the first pixel is a green (G) pixel and the second pixel is a blue (B) pixel, the image sensor further comprising at least one red (R) pixel.

9. The image sensor of claim 1, wherein the first pixel and the second pixel are gray scale pixels.

* * * * *